US006396284B1

(12) United States Patent
Tisdale et al.

(10) Patent No.: US 6,396,284 B1
(45) Date of Patent: May 28, 2002

(54) GROUND RESISTANCE MONITOR

(75) Inventors: Ralph C. Tisdale, Palos Verdes Estates; Emanuel H. Hirsch, Manhattan Beach, both of CA (US)

(73) Assignee: Ramcom Systems, Inc., Torrance, CA (US)

( * ) Notice: Subject to any disclaimer, the term of this patent is extended or adjusted under 35 U.S.C. 154(b) by 81 days.

(21) Appl. No.: 09/589,687

(22) Filed: Jun. 9, 2000

(51) Int. Cl.[7] .............................................. G01R 31/28
(52) U.S. Cl. ...................................................... 324/525
(58) Field of Search ................................ 324/509, 510, 324/522, 523, 525, 557, 705; 361/42, 47, 48, 49, 50, 88, 93.1; 340/649, 650

(56) References Cited

U.S. PATENT DOCUMENTS 4,146,834 A * 3/1979 Maltby et al. ............. 324/60 R
4,707,759 A * 11/1987 Bodkin ........................ 361/48
5,969,432 A * 10/1999 Zabler et al. ............. 307/10.1

* cited by examiner

Primary Examiner—Safet Metjahic
Assistant Examiner—Etienne LeRoux
(74) Attorney, Agent, or Firm—Irving Keschner

(57) ABSTRACT

A permanently mounted AC powered control/display unit and a remote sensor for use in measuring ground resistance. The sensor is permanently mounted around the earth grounding cable. The control display unit generates a 1953 Hz, 5 Vac sine wave which is sent via a cable to a 100:1 ratio drive transformer in the remote sensor. The transformer induces a 0.05 Vac sine wave in the ground cable. The resulting current is detected by a 100:1 turns ratio sense transformer. The current is returned via the cable to the control display unit and converted to a voltage, filtered, amplified and rectified by a synchronous rectifier. The rectified voltage is again filtered and presented to an analog to digital converter. A microprocessor reads the output of the analog to digital converter and the ground resistance is computed by using Ohm's Law (R=E/I), the result being shown on a display.

4 Claims, 4 Drawing Sheets

GROUND RESISTANCE MONITOR

BACKGROUND OF THE INVENTION

1. Field of the Invention

The present invention provides an improved device for continuously measuring the electrical resistance between a grounding rod and earth ground; an alarm is triggered if the resistance is outside a preset range.

2. Prior Art

Several prior art systems are currently available that measure electrical resistance between a grounding rod and earth ground.

One such system requires the opening of the connection between the electrical safety ground and the earth grounding system. Current is injected into the earth grounding rod and a series of voltage measurements recorded. Ground resistance is calculated from these measurements. The main drawback to this approach is that the earth ground—safety ground link must be opened. This violates electrical code and OSHA rules unless all the equipment attached to the safety ground is turned off. Shutting down equipment to comply, such as telephone switch systems, air traffic systems and on-line computer centers is difficult to accomplish and disruptive to users of the equipment.

A second prior art system does not require that the safety ground—earth ground link be opened. This system utilizes the multiple electric utility safety grounds as the return path and assumes that, since there are numerous parallel earths, this return has very low resistance. Current is injected between the safety ground and the ground rod to be tested. The resulting voltage is measured, and the resistance calculated. However, the measuring device is not permanent but utilizes a hand-held clamp on meter.

What is desired is to provide a device for measuring ground current which is accurate, can be permanently affixed to a site and wherein an alarm is triggered if the resultant resistance measurement is outside a preset range.

SUMMARY OF THE PRESENT INVENTION

The present invention consists of a permanently mounted AC powered control/display unit and a remote sensor for use in measuring ground resistance. The sensor is permanently mounted around the earth grounding cable. The control display unit generates a 1953 Hz, 5 Vac sine wave which is sent via a cable to a 100:1 ratio drive transformer in the remote sensor. The transformer induces a 0.05 Vac sine wave in the ground cable. The resulting current is detected by a 100:1 turns ratio sense transformer. The current is returned via the cable to the control display unit and converted to a voltage, filtered, amplified and rectified by a synchronous rectifier. The rectified voltage is again filtered and presented to an analog to digital converter. A microprocessor reads the output of the analog to digital converter and the ground resistance is computed by using Ohm's Law (R=E/I), the result being shown on a display.

The synchronous rectifier is an analog switch which is alternately connected to the sense voltage and to ground. The switch is controlled by the same 1953 Hz square wave that also, after filtering, drives the drive transformer. A synchronous rectifier has two advantages. In particular, any noise at frequencies other than the control frequency (1953 Hz) will average to zero. In addition, a 1953 Hz sine wave that is 90 degrees out of phase with the control square wave will also average to zero.

Using a synchronous rectifier in the ground measuring device of the present invention reduces the complexity of the remote sensor by removing the need for precision magnetic cores, complex distributed coil winding, and extensive magnetic shielding to prevent interaction between the drive and sense transformers. Placing a calibration table in nonvolatile memory in each remote sensor greatly reduces the cost and complexity of the remote sensor since standard tolerance parts and processes can be used and still maintain the interchangeability and accuracy requirements.

The present invention thus provides a ground resistance sensing device which is more accurate and less expensive than those devices currently available in the prior art.

DESCRIPTION OF THE DRAWING

For better understanding of the present invention as well as other objects and further features thereof, reference is made to the following description which is to be read in conjunction with the accompanying drawing therein.

DESCRIPTION OF THE INVENTION

Figure 1:
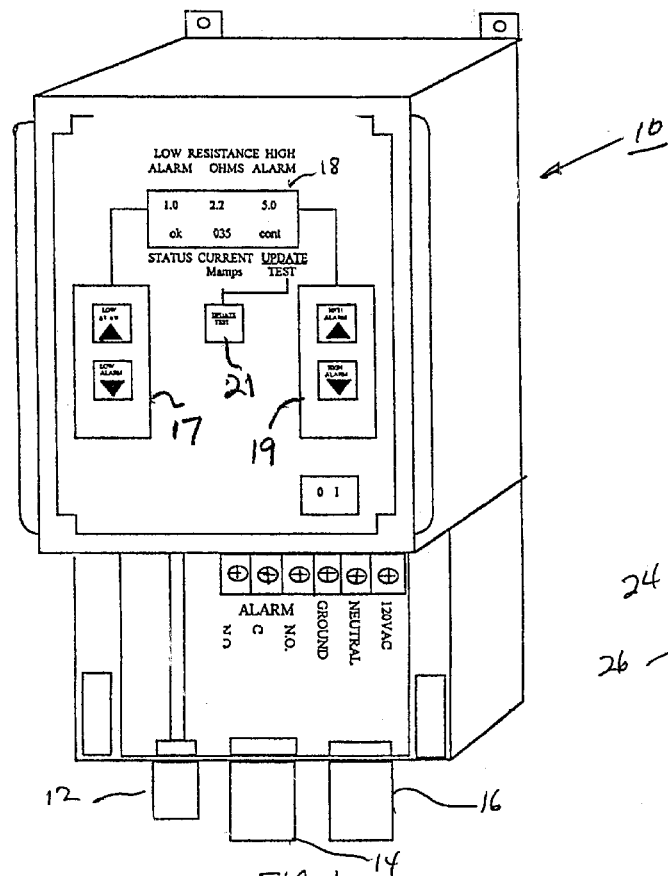
FIG. 1 is a perspective view of the novel ground monitoring device of the present invention.

FIG. 1 is a perspective view of the novel ground resistance sensing device 10 of the present invention with the wiring component cover 12 removed. Leads 12, 14 and 16 are for the sensor connector, alarm and power functions, respectively. A display 18 provides the resistance readout in ohms (and milliamps) and also shows the preset low alarm value and high alarm value (described in more detail hereinafter) system status and mode condition. Panel switch 17 controls the low alarm value setting and panel switch 19 controls the high alarm value setting. Switch 21 enables the user to cycle through different modes as desired, i.e. continuous update; one per hour update, one per 8 hour update, and test.

Figure 2:
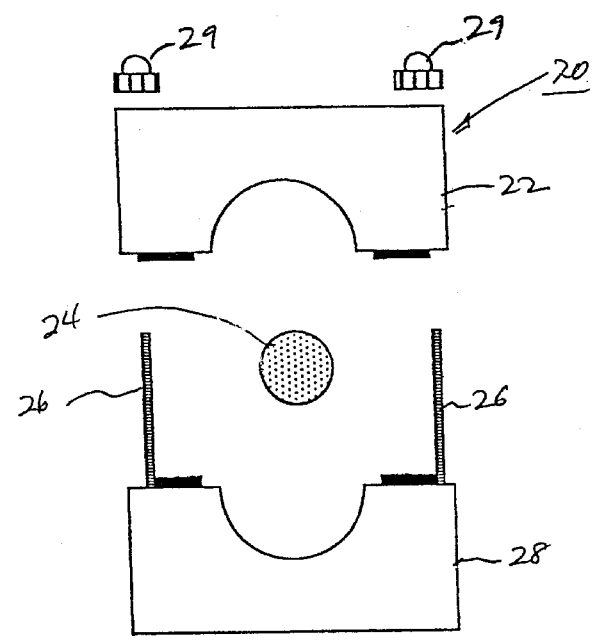
FIG. 2 is an end view of the remote sensor utilized in the device of the present invention.
Figure 1:
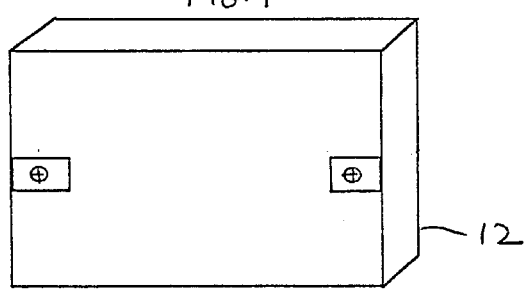

FIG. 2 is an end view of remote sensor 20, showing top core portion 22, ground wire 24, mounting bolts 26 and sensor base 28.

Figure 3:
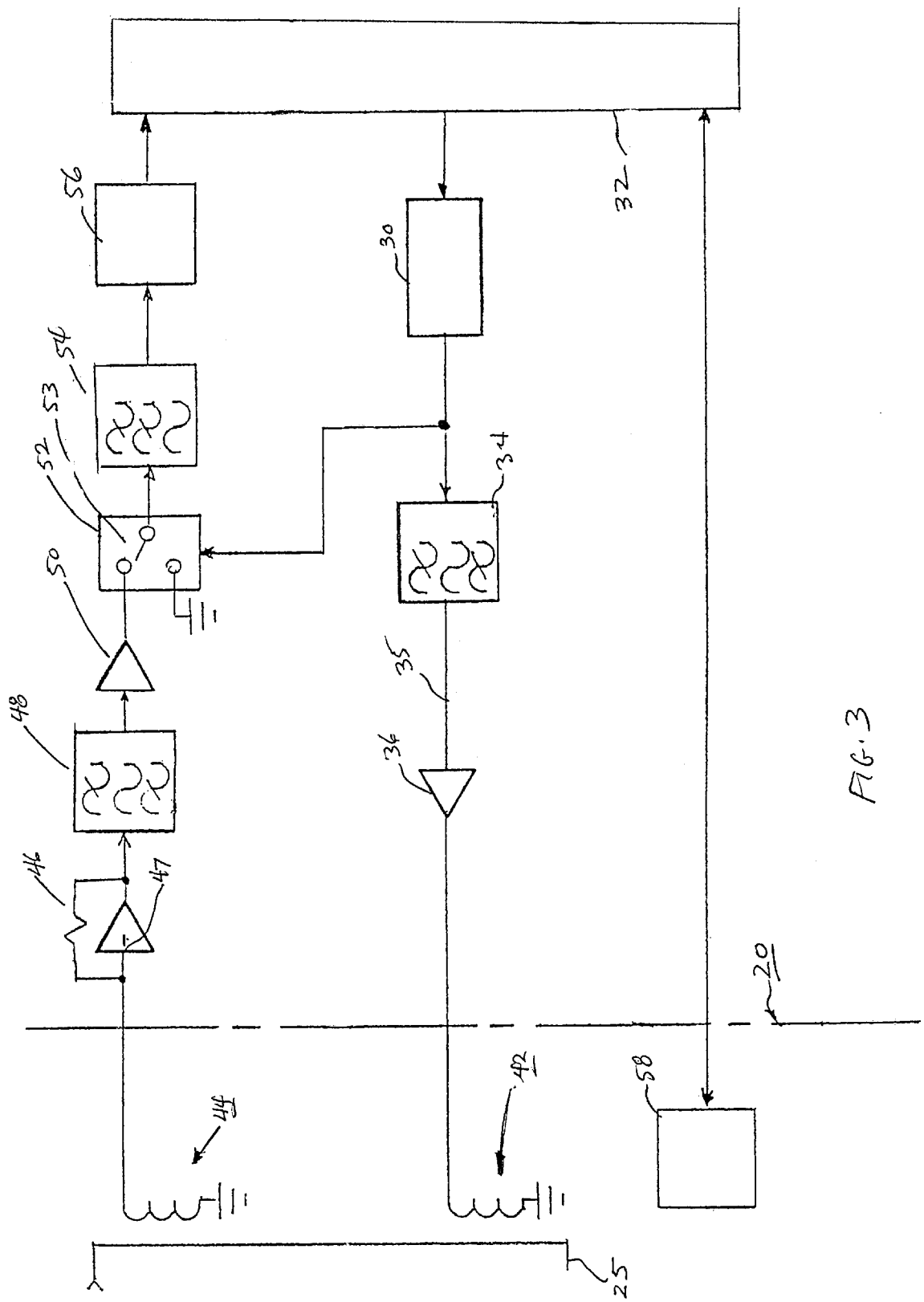
FIG. 3 is a block diagram of the components of the present invention.

Referring now to the block diagram of FIG. 3, counter 30 generates a 1953 Hz square wave in response to the 8 Mhz crystal in microprocessor 32. The square wave is passed through 1953 Hz band pass filter 34, the output thereof being a sine wave. The sine wave output on lead 35 is coupled to power amplifier 36 which amplifies the wave to 5 V rms, the amplified wave being coupled to drive transformer 42 in remote sensor 20.

Drive transformer 42 comprises a primary coil of 100 turns wound around a ferrite core. The secondary sense transformer 44 is the large gage ground rod cable which is placed through the core resulting in a 100:1 turns ratio transformer. Since the input to drive transformer 42 is 5 vac, the voltage induced in the ground line is 0.050 vac.

By Ohm's Law, (current=voltage/resistance), the current induced in the ground line is 0.050 volts divided by the ground resistance. This current is detected by the sense transformer 44, essentially identical to drive transformer 32.

Since sense transformer 44 has a 100:1 turns ratio, the current returned through the cable is ¹⁄₁₀₀ of the current flowing in the ground wire.

The 1953 Hz AC sense current is converted to a voltage by the current to voltage converter 46. Converter 46 is an operational amplifier with the current flowing directly into the inverting input 47. The voltage is then coupled to 1953 Hz band pass filter 48 and amplified by amplifier 50.

Figure 4A:
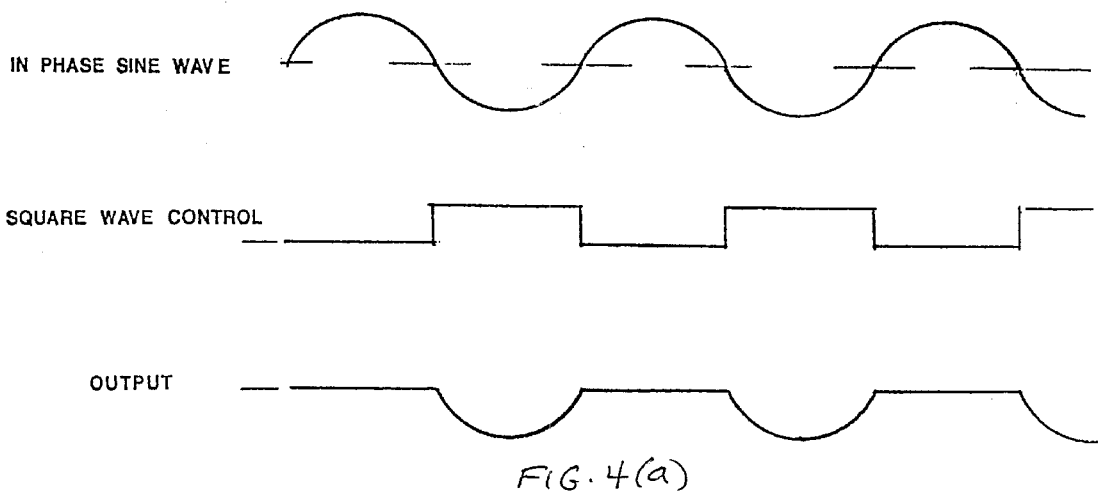
FIGS. 4(a) and 4(b) are waveforms illustrating the operation of the synchronous rectifier utilized in the present invention.
Figure 4B:
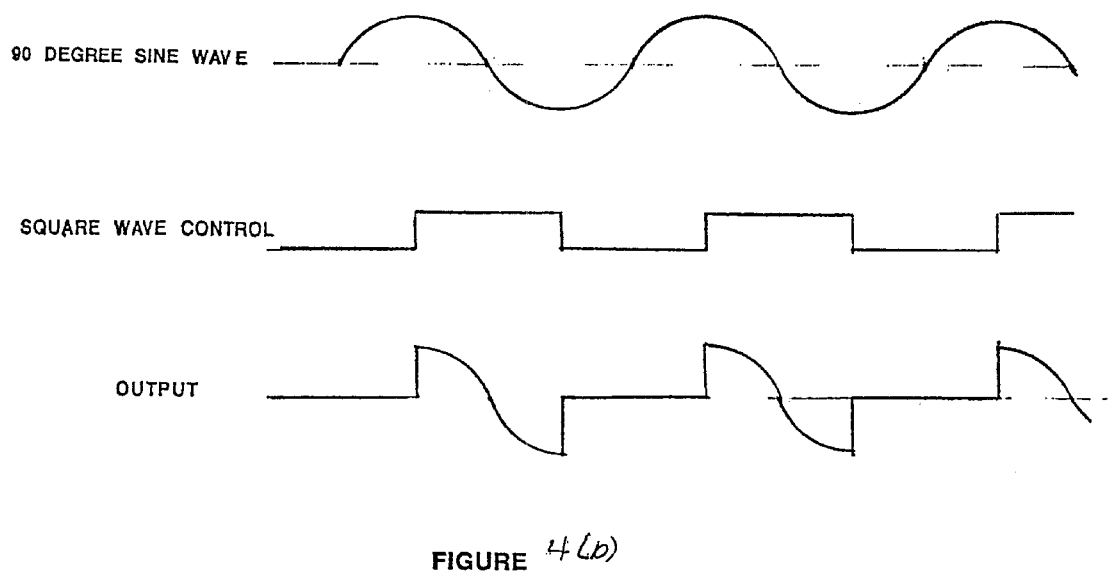

A synchronous rectifier 52 converts the ac sense voltage to dc. Synchronous rectifier 52 is an analog switch which is alternately connected to the sense voltage and to ground by a switch 53. Switch 53 is controlled by the same 1953 Hz square wave that, after filtering, drives the drive transformer 42 (see FIG. 4(*a*)). Synchronous rectifier 52 has two advantages when used in the present invention. In particular, any noise at frequencies other than the control frequency (1953 Hz) will average to zero. In addition, a 1953 Hz sine wave that is 90 degrees out of phase with the control square wave will also average to zero (see FIG. 4(*b*)). The analog switch 53, in a preferred embodiment, is a CMOS anolog switch, such as the MC14053 manufactured by Motorola, Inc. Schaumburg, Ill.

The output of rectifier 52 is coupled to filter 54 and the filtered output is then coupled to analog to digital converter 56. The digital output of converter 46, which is proportional to the sense current, is read by microprocessor 32. The microprocessor, such as the MC685711E9, also manufactured by Motorola, computes the ground resistance by Ohm's Law and the result is shown on a display 18, such as a liquid crystal display.

A major complication in the design of remote sensor 20 is the fact that the drive and sense transformers are not perfect and a leakage magnetic flux may be coupled between the drive and sense transformers. This flux, if not shielded or otherwise accounted for, will cause errors in the resistance calculation since it will induce the sense transformer to output more current than that which is flowing in the ground wire. Since this coupling is magnetic, the current it induces has a phase of 90 degrees with respect to the drive voltage. Synchronous rectifier 52 eliminates this problem, since as described hereinabove, a sine wave at a phase of 90 degrees will average to zero.

A second problem with remote sensors is that unit to unit variation of the sensed current is greater than 20%. The sensors and the control/display units should be interchangeable and have an accuracy of 1%. In accordance with the teachings of the invention, in order to achieve this accuracy, a calibration table is placed in nonvolatile memory 58 in the sensor 20. Before the microprocessor 32 makes a resistance calculation, this table is read and utilized to compensate for any errors in sensor 20. The table is loaded during manufacturing where the sensed current is derived using NIST traceable precision resistors.

Using synchronous rectifier 52 in the ground measuring device of the present invention reduces the complexity of the remote sensor by removing the need for precision magnetic cores, complex distributed coil winding, and extensive magnetic shielding to prevent interaction between the drive and sense transformers. Placing a calibration table in nonvolatile memory in each remote sensor greatly reduces the cost and complexity of the remote sensor since standard tolerance parts and processes can be used and still remain within interchangeability and accuracy requirements.

If the measured resistance is outside preset values, alarm 50 is activated to warn users of the condition. The alarm function operates as follows: The user sets the low alarm value and high alarm value using the front panel arrow switches 17 and 19, respectively, shown in FIG. 1. During system operation, if the measured ohms value is less than the low value alarm or if the measured ohms is greater than the high alarm value, the alarm is triggered. When the alarm is triggered, an audio buzzer beeps to warn personnel and a relay contact is closed. The relay contact can be wired by a user to the monitoring equipment so that an alarm condition can be detected from a remote site.

Figure 5:
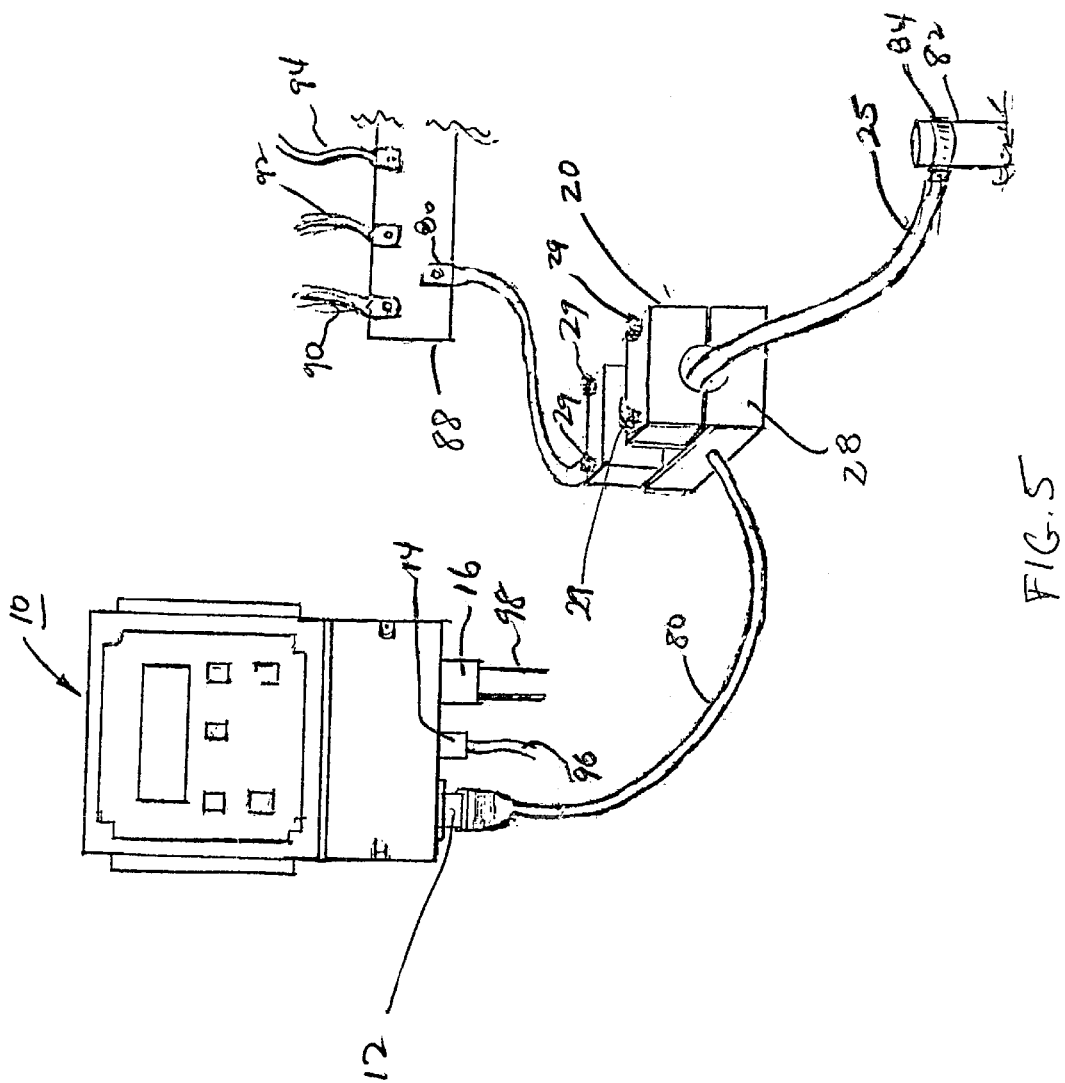
FIG. 5 schematically illustrates how the device of the present invention is installed.

FIG. 5 illustrates a typical installation for device 10. In particular, a sensor cable 80 connects device terminal 12 to sensor box 20 as shown. The sensor 20 is installed around earth ground cable 25 by removing top cores 20 and placing cable 25 over the sensor base 28. The top cores 20 are then installed over cable 25 and tightened down using nuts 29 (the installer should make sure that the core ends are clean and free of dirt and dust). One end of cable 25 is secured to earth ground rod 82 using clamp 84; the other end 86 of cable 5 is secured to safety ground buss 88. Connectors 90, 92 and 94 are coupled to the equipment and utility grounds. Alarm cable 96 connects contact 14 to the user equipment and AC power conduit 98 connects contact 16 to the appropriate AC power source.

While the invention has been described with reference to its preferred embodiments, it will be understood by those skilled in the art that various changes may be made and equivalents may be substituted for elements thereof without departing from the true spirit and scope of the invention. In addition, many modifications may be made to adapt a particular situation or material to the teachings of the invention without departing from its essential teachings.

What is claimed is:

1. A ground resistance device comprising:

a microprocessor having first, second and third input/output ports;

a remote sensor having drive and sense transformers;

means coupled to said first microprocessor input/output port for receiving a signal from said microprocessor and generating an amplified AC signal therefrom, the AC signal being coupled to said drive transformer;

earth ground cable means responsive to the output of said drive transformer and producing a related signal in said sense transformer;

means coupled to the output of said sense transformer for providing an amplified ac voltage signal at its output, said voltage signal being connected to a synchronous rectifier; and means connected to the output of said synchronous rectifier for providing a digital signal at said second microprocessor input/output port, said microprocessor calculating the resistance of said earth ground cable.

2. The ground resistance device of claim 1 wherein said remote sensor has memory means, an output on said microprocessor third input/port controlling data stored in said memory means.

3. The ground resistance device of claim 1 wherein the output signal on said microprocessor third input/output port controls the switching rate of said synchronous rectifier.

4. The ground resistance device of claim 1 further including a monitor for viewing the resistance calculated by said microprocessor.

* * * * *